United States Patent [19]
Terry et al.

[11] 3,785,892
[45] Jan. 15, 1974

[54] METHOD OF FORMING METALLIZATION BACKING FOR SILICON WAFER

[75] Inventors: Louis E. Terry; Richard W. Wilson, both of Phoenix, Ariz.

[73] Assignee: Motorola, Inc., Franklin Park, Ill.

[22] Filed: May 19, 1972

[21] Appl. No.: 255,170

[52] U.S. Cl. .......................... 156/3, 117/119, 156/7, 156/17
[51] Int. Cl. .......................... H01l 7/50
[58] Field of Search .......................... 117/107, 107.2 R, 117/119, 212; 156/3, 7, 17, 155; 29/583

[56] References Cited

UNITED STATES PATENTS

| | | | |
|---|---|---|---|
| 3,307,239 | 3/1967 | Lepselter et al. | 156/17 X |
| 3,607,379 | 9/1971 | Leinkram et al. | 117/212 |
| 3,634,159 | 1/1972 | Toronto | 117/212 |
| 3,689,392 | 9/1972 | Sandera | 156/17 X |

*Primary Examiner*—William A. Powell
*Attorney*—Foorman L. Mueller et al.

[57] ABSTRACT

A wafer of semiconductive material used to form beam lead devices is temporarily bonded face down to a sapphire base member with a low melting temperature wax. A layer of chromium or titanium then is vacuum deposited onto the back of the chip followed by vacuum deposition of a layer of gold. The chromium forms a good low temperature bond to the silicon and the gold in turn forms a good low temperature bond to the chromium so that the gold-chromium layers adhere tightly to the silicon through subsequent etching and separation steps. After the wafer is separated into individual chips or dice, a gold-silicon eutectic bond is formed by heating the chips to the eutectic temperature, with the gold-silicon alloying taking place by a diffusion of the gold through the chromium layer.

10 Claims, 13 Drawing Figures

METHOD OF FORMING METALLIZATION BACKING FOR SILICON WAFER

BACKGROUND OF THE INVENTION

In the beam lead integrated circuit devices it is conventional to mount the beam lead devices on a substrate face or metallization side down by the use of thermal compression bonding of the beams. This method, although convenient and readily performed, is not conducive to forming an intimate heat conductive path such as would be formed between the chip and the substrate by a gold-silicon eutectic bond. Such a eutectic bond is advantageous to permit the dissipation of heat from the beam lead dice onto the substrate enabling operation in higher power applications.

To facilitate the making of a gold-silicon eutectic bond between the chip and the substrate the beam lead chip could be attached to the substrate face up and a gold-silicon eutectic bond then could be formed between the back of the chip and the substrate. Because of the nature of the beam lead processing, that is back lapping in which the wafer is cemented to a sapphire plate, the typical gold-silicon backing wherein the gold is deposited onto the back of the silicon wafer and then alloyed in at approximately 370° to 450°C cannot be used since temperatures this high melt or destroy the cement which bonds the wafer to the sapphire for subsequent processing steps. On the other hand, although gold can be deposited on the back of the wafer at lower temperatures, it does not adhere sufficiently tightly to the silicon to permit the structure to remain intact through the separation etch processing steps.

SUMMARY OF THE INVENTION

It is an object of this invention to provide an improved method of forming a metallization backing for a silicon wafer.

It is a further object of this invention to apply a gold layer to a silicon wafer at relatively low temperatures prior to the separation etch steps to form individual die in a manner to cause the gold to adhere sufficiently tightly to the silicon to permit the structure to remain intact during etching and handling without formation of a gold-silicon eutectic bond prior to the separation operation.

It is a further object of this invention to provide a method of producing a gold backing for beam lead devices.

In accordance with the preferred embodiment of this invention, metallization backing for a silicon wafer used to form beam lead structures is formed by the steps of temporarily cementing the active or metallization face of the silicon wafer to a sapphire base by means of an adhesive having a melting temperature which is less than the temperature required to form a gold-silicon eutectic bond. A layer of chromium or titanium then is vacuum deposited on the exposed surface of the silicon wafer followed by the vacuum deposition of a layer of gold on top of the chromium or titanium layer. The wafer is etched on the side having the vacuum deposited layer of gold to form etched moats defining individual dice to be formed from the wafer. Following the separation etching of the wafer, the individual die are removed from the sapphire base member by dissolving the cement in a suitable solvent. A gold-silicon eutectic bond is formed on the die by heating the die to a temperature sufficient to cause the alloying of the gold by diffusion through the chromium layer to the silicon during the die bonding operation.

DETAILED DESCRIPTION

In the conventional methods of making transistors or integrated circuits (IC's) many transistors or IC's are placed on one side of a semiconductor wafer of silicon in a pre-established pattern. After the individual transistors or integrated circuits are formed, the wafer is scribed and divided into a plurality of chips. To facilitate bonding of the chips to a suitable substrate and to effect a most efficient heat transfer between the chip and the substrate, it is desirable to deposit metal such as gold on the back or reverse side of the chips and to form an intimate bond between the chip and the substrate in the form of a gold-silicon eutectic bond. Such a eutectic bond is formed by alloying the gold and silicon at a temperature in the range of 370° to 450°C.

Figure 1:
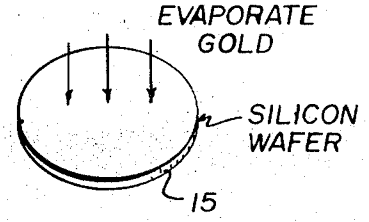
FIGS. 1 to 3 illustrate the conventional prior art method of forming a gold-silicon eutectic bond on the surface of a silicon wafer.
Figure 2:
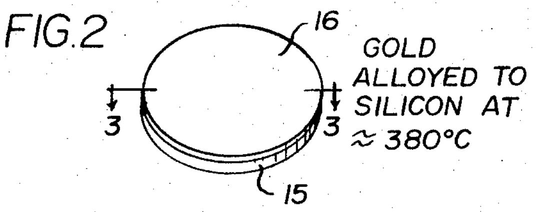
Figure 3:
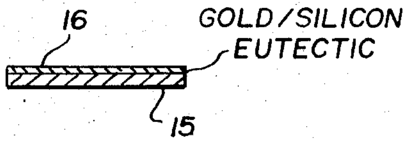

This conventional technique is illustrated in FIGS. 1, 2 and 3, with FIG. 1 showing the step of evaporating or vacuum depositing a layer of gold onto the back side of a silicon wafer. Next, as indicated in FIG. 2, the gold is alloyed to the silicon to form a eutectic gold-silicon bond at approximately 380°C thereby forming a strong intimate bond between the gold layer 16 and the silicon wafer 15. FIG. 3 illustrates a cross-section of the gold-backed wafer shown in FIG. 2.

In the fabrication of conventional devices following formation of the gold-silicon eutectic bond, the wafer is scribed by a scribing tool on the active face between the individual transistors or integrated circuits on the side opposite the side plated with the gold (this would be the lower side of the silicon wafer 15 as shown in FIG. 3) to produce break lines to delineate the individual transistors and circuits which have been formed on the wafer. Then the individual transistors or integrated circuits are produced by breaking the wafer on the several scribed lines resulting in square or rectangular chips, on each of which a transistor or an integrated circuit is formed.

In the manufacture of beam lead devices, the active face or side of the device on which the transistors or integrated circuits are formed is cemented to a base or carrying member such as a sapphire plate for further processing. The cement is generally in the nature of a wax which is adhesive at room teperature and which melts at a temperature lower than the temperature necessary to form a gold-silicon eutectic bond. It is necessary to attach the wafer for forming beam lead devices to a base member to permit back lapping the wafer in one of the processing steps. Although gold can be deposited onto the back of a wafer following such back lapping, it cannot be alloyed to the silicon at the temperatures necessary to form a eutectic bond since such temperatures would melt or destroy the cement which holds the wafer to the sapphire.

To reduce the number of processing steps and, as a result, to reduce the cost of fabricating these devices, it is desirable to perform the step of separating the wafer to separate the individual devices while the wafer is bonded to the sapphire plate. Since it is impractical to back or plate each individual chip or dice with gold after it has been separated, it is desirable to plate the entire wafer prior to the separation etch step. Since gold, however, does not adhere sufficiently tightly to silicon at lower temperatures, the step of separation etching and handling a gold plated silicon wafer without the normal eutectic alloying results in the displacement or removal of gold from some of the individual chips or die, thereby substantially reducing the yield and increasing the cost.

Figure 4:
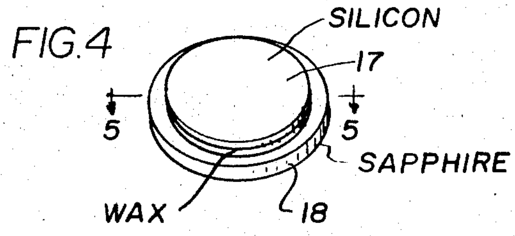
FIGS. 4 to 12 illustrate the steps of a preferred embodiment of this invention.
Figure 5:
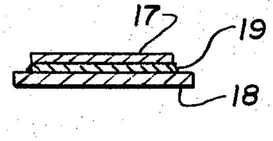

To overcome the above problem, a silicon wafer 17 is bonded to a sapphire plate 18 with a suitable cement 19 such as the wax conventionally used for this purpose in beam lead semiconductor processing. The wafer 17 shown in FIGS. 4 and 5 is one which is to be used to form a number of beam lead devices, so that the integrated circuits formed on the silicon wafer 17 are formed on the surface of the wafer which is bonded to the plate 18 by the wax 19. In other words, the wafer 17 is bonded active face down to the sapphire plate 18.

Figure 6:
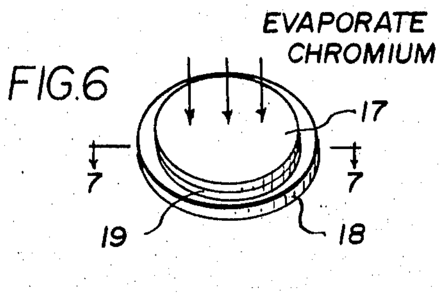
Figure 7:
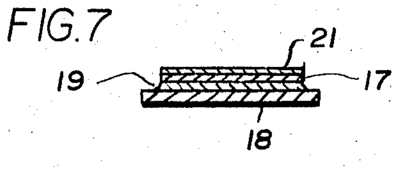
Figure 8:
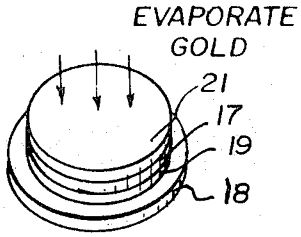

To facilitate the adhesion of gold to the back side (the upper side of the wafer 17 as viewed in FIG. 5), the wafer 17 is placed in a conventional vacuum system approximately 12 inches above a source of chromium. The system then is pumped down to $5 \times 10^{-6}$ Torr and 100 to 200 angstroms of chromium is evaporated onto the exposed surface of the wafer 17, as illustrated in FIG. 6. This evaporation preferably is accomplished with an electron gun, so that heating of the wafer is kept to a minimum to prevent melting of the wax 19. The time required to vacuum deposit 100 to 200 angstroms of chromium is approximately 10 seconds. At room temperatures, the chromium forms an intimate bond with the silicon, and this bond is sufficient to prevent lifting of the chromium from the silicon during subsequent separation etch and separation processing steps. FIG. 7 shows a cross-section of the silicon wafer 17 with the chromium layer 21 shown deposited on the back or upper surface.

Immediately following the termination of the evaporation of the chromium onto the wafer 17, a layer of gold is vacuum deposited or evaporated onto the surface of the chromium. A gold layer of approxiamtely 10,000 angstroms is deposited and it requires approximately 10 minutes for this to be accomplished in a typical process. The gold can be evaporated from a resistance heated boat, and once a good layer of gold has been deposited, it is a fairly efficient reflector of heat radiation which tends to keep the wafer 17 from becoming hot enough to melt the wax 19 on the front side of the wafer.

Figure 9:
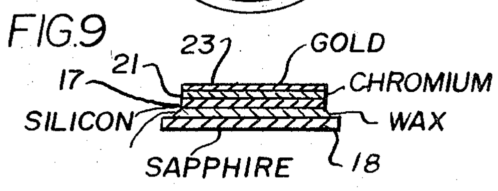

After the gold layer 23 has been deposited on the chromium layer 21, as best shown in FIG. 9, the wafer is removed from the vacuum system for completion of the subsequent processing steps. Although the layer 21 has been specificed as comprising chromium, titanium could be substituted for the chromium. The layer 21 is used primarily to obtain sufficient adhesion of the gold to it, and therefore to the silicon wafer 17, to prevent lifting up of the gold during etching and die handling.

Figure 10:
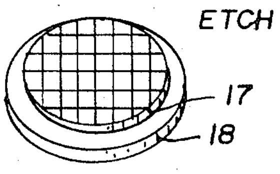

As illustrated in FIG. 10, upon removal of the wafer from the vacuum system, etching of the surface having the gold and chromium layers deposited thereon is effected in a conventional manner. The gold adheres firmly to the chromium which in turn adheres firmly to the silicon, so that subsequent handling does not lift off the gold or chromium even though no eutectic bonding of the gold to the silicon has taken place up to this point in the processing steps. Following the separation etch of the wafer, as indicated in FIG. 10, the wafer 17 is placed in a suitable solvent to dissolve the wax 19 and to permit removal of individual die from the sapphire plate. Because of the intimate bonding of the chromium to the silicon and the gold to the chromium very little loss or spoilage occurs during the etching and die separation.

Figure 11:
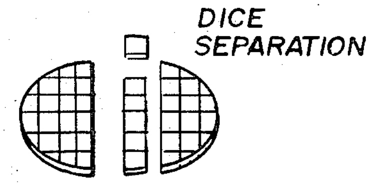
Figure 12:
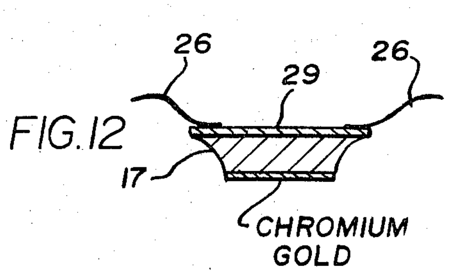
Figure 13:
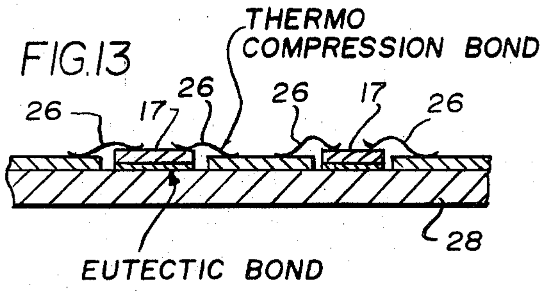
FIG. 13 illustrates the attachment of the individual dice formed by the process illustrated in FIGS. 4 through 12 to a suitable substrate.

Following the die separation illustrated in FIG. 11, the individual dice are ready to be bonded, face up, to a suitably prepared and patterned substrate. FIG. 12 shows details of an individual dice with a conventional oxide and nitride layer 29 over the silicon 17 and with beam leads 26 attached to metallization on active parts of the dice. The bonding of the die (face up) to a substrate 28 (FIG. 13) can be done using two different procedures. The beams 26 can be bonded to the substrate metallization first using conventional thermocompression methods and then the main body of the chip or dice is eutectic bonded by pressing down the chip and heating the substrate, or the chip can be eutectic bonded (face side up) to the substrate 28 first and then the beams 26 are thermocompression bonded to the substrate metallization. Typically 425° to 450°C is used to form a gold-silicon eutectic bond. This takes place in a few seconds at 425° to 450°C and the alloying to form the gold-silicon eutectic bond takes place by diffusion of the gold through the thin chromium layer 21. At temperatures lower than 425°C and nearer to 370°C, the time required to form the eutectic bond is greater. The range of 425° to 450°C has been found to be satisfactory, but should not be construed as limiting. Forming of the gold-silicon eutectic bond through the chromium layer for all practical purposes does not significantly alter conventional eutectic bonding cycles in which no chromium layer is present. A similar result is obtained when titanium is used in place of chromium since both metals permit ready diffusion of the gold through them to the silicon.

We claim:

1. A method of forming a metallization backing for a silicon wafer including the steps of:

temporarily cementing the active face of the silicon wafer on a base member for processing with a cement which is adhesive at room temperature and which melts at a temperature less than the temperature required to form a gold-silicon eutectic bond;

forming a first layer of metal from the group consisting of chromium and titanium on the exposed surface of the silicon wafer;

forming a layer of gold on the surface of said first layer;

etching said wafer in a grid pattern on the side having said layer of gold;

removing said wafer from said base member; and separating said wafer on said etched grid pattern to produce a plurality of individual chips.

2. The method according to claim 1 including the further step of bonding the chips to a substrate by both thermal compression bonding of the beam leads and eutectic bonding of the silicon chip.

3. The method according to claim 1 wherein the step of removing said wafer from the base member comprises dissolving the cement.

4. The method according to claim 1 further including the step of alloying the gold to the silicon through the first layer.

5. The method according to claim 2 wherein said eutectic bonding step comprises heating said chips to a temperature in excess of 370°C.

6. The method according to claim 5 wherein the temperature to which said chips are heated is 425° to 450°C.

7. The method according to claim 1 wherein the step of forming said first layer of metal and the step of forming the layer of gold both comprise steps of vacuum depositing said layers.

8. The method according to claim 7 wherein the step of vacuum depositing said first layer of metal is used to deposit a layer having a thickness of 100 to 200 angstroms and the step of vacuum depositing the gold layer is used to deposit a layer of gold having a thickness of approximately 10,000 angstroms.

9. The method according to claim 8 further including the step of heating said chips to a temperature in excess of 370°C to form a gold-silicon eutectic alloy through the first layer of metal.

10. The method according to claim 9 wherein the temperature to which said chips are heated in 425° to 450°C.

* * * * *